United States Patent
Boehm et al.

(10) Patent No.: US 10,406,938 B2
(45) Date of Patent: Sep. 10, 2019

(54) METHOD FOR MINIMIZING CELL AGING OF A BATTERY AND/OR BATTERY COMPRISING AN APPARATUS FOR MINIMIZING CELL AGING OF THE BATTERY

(71) Applicant: Robert Bosch GmbH, Stuttgart (DE)

(72) Inventors: Andre Boehm, Marbach am Neckar (DE); Andres Lemke, Stuttgart (DE); Alfons Doerr, Stuttgart (DE); Christian Korn, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 405 days.

(21) Appl. No.: 15/027,553

(22) PCT Filed: Sep. 25, 2014

(86) PCT No.: PCT/EP2014/070530
§ 371 (c)(1),
(2) Date: Apr. 6, 2016

(87) PCT Pub. No.: WO2015/052009
PCT Pub. Date: Apr. 16, 2015

(65) Prior Publication Data
US 2016/0243957 A1 Aug. 25, 2016

(30) Foreign Application Priority Data
Oct. 8, 2013 (DE) .................. 10 2013 220 243

(51) Int. Cl.
*H02J 7/00* (2006.01)
*B60L 58/16* (2019.01)
(Continued)

(52) U.S. Cl.
CPC .............. *B60L 58/16* (2019.02); *B60L 58/12* (2019.02); *G01R 31/3842* (2019.01);
(Continued)

(58) Field of Classification Search
USPC ........................................................ 320/130
See application file for complete search history.

(56) References Cited

U.S. PATENT DOCUMENTS

| | | | |
|---|---|---|---|
| 2009/0015200 A1* | 1/2009 | Wieger | H01M 2/38 320/130 |
| 2013/0090900 A1* | 4/2013 | Gering | G01R 31/3651 703/2 |

FOREIGN PATENT DOCUMENTS

| | | |
|---|---|---|
| CN | 102998626 | 3/2013 |
| DE | 102007031568 | 1/2009 |

(Continued)

OTHER PUBLICATIONS

International Search Report for Application No. PCT/EP2014/070530 dated Feb. 11, 2015 (English Translation, 3 pages).

(Continued)

*Primary Examiner* — Eric D Lee
(74) *Attorney, Agent, or Firm* — Michael Best & Friedrich LLP

(57) ABSTRACT

The present invention relates to a method for minimizing cell aging of a battery (1) and/or a battery (1) comprising an apparatus for minimizing cell aging of the battery (1). For this the following is performed: detection of battery parameters which describe the present state of the battery (1); checking, on the basis of a preset aging model and the battery parameters, whether the state of the battery (1) is an aging state in which the cell aging of the battery (1) is less pronounced in the case of cyclic charging or discharging than in a quiescent state in which there is no charging or discharging of the battery (1); and cyclic partial discharging and partial charging of the battery (1) if the battery (1) is in such an aging state. The method according to the invention and/or the battery (1) according to the invention are characterized by reduced cell aging. This means that such a (Continued)

battery (1) and/or a battery (1) to which the method is applied has an extended life. This results in particular in cost advantages, ecological advantages and improved user friendliness.

11 Claims, 1 Drawing Sheet

(51) Int. Cl.
    *G01R 31/392*     (2019.01)
    *G01R 31/3842*     (2019.01)
    *H02J 7/02*     (2016.01)
    *B60L 58/12*     (2019.01)

(52) U.S. Cl.
    CPC ............ *G01R 31/392* (2019.01); *H02J 7/007* (2013.01); *H02J 7/02* (2013.01); *Y02T 10/705* (2013.01); *Y02T 10/7011* (2013.01); *Y02T 10/7044* (2013.01)

(56) References Cited

FOREIGN PATENT DOCUMENTS

| | | |
|---|---|---|
| DE | 102008001717 | 11/2009 |
| DE | 102009002496 | 10/2010 |
| DE | 102012000847 | 7/2012 |
| DE | 102011080638 | 2/2013 |

OTHER PUBLICATIONS

Guenther et al., "Model-based investigation of electric vehicle battery aging by means of vehicle-to-grid scenario simulation," Journal of Power Source, Elsevier Sa. CH, vol. 239, Feb. 26, 2013, pp. 604-610.

\* cited by examiner

… are the abovementioned aging
METHOD FOR MINIMIZING CELL AGING OF A BATTERY AND/OR BATTERY COMPRISING AN APPARATUS FOR MINIMIZING CELL AGING OF THE BATTERY

BACKGROUND OF THE INVENTION

The present invention relates to a method for minimizing cell aging of a battery and, respectively, to a battery comprising an apparatus for minimizing cell aging of the battery.

Motor vehicles comprising an electric drive (electric vehicles, hybrid electric vehicles, plug-in hybrid electric vehicles etc.) often have so-called electrochemical cells, such as lithium-ion cells or iron-metal hydride cells for example, as storage means for energetic electrical charge. These cells are not in a stable equilibrium state in the state range in which they are used as energy stores. That is to say, firstly the cells discharge with a current which typically lies in the µA or mA range. Secondly, the cells also undergo irreversible decomposition reactions. Therefore, the structures react to a changed chemical composition which limits the range of use of the cell. Therefore, these reactions are called cell aging. Cell aging depends on many factors, so-called aging or acceleration factors. These factors include, as the most important factor, the temperature, but also the state of charge (SOC) of the cell. These two factors are critical determinants of calendar aging, that is to say that aging which is independent of the use of the battery or of the cell. Use-dependent aging factors (so-called cyclical aging) are, for example, the flowing charging and discharging currents, the charging/discharging stroke and also the temperature and further factors. Cell aging can be expressed, for example, with respect to the usable capacitance C, that is to say at the time t0, the capacitance $C(t0)=C0$. At later times, $C(t>t0)<C0$ due to aging.

Aging can be described in the form of a model (abstractly) as an aging factor—and state-dependent function:

$$C(t)=f(AF1,AF2,Z1,Z2,\ldots,C0,t).$$

Here, AF1, AF2 etc. … are the abovementioned aging factors. Z1, Z2 etc. describe states, such as storage, charging, discharging etc., and t is time.

An analogous description can also be specified for aging of the internal resistance of the cell or other relevant properties for which the cell has been designed.

SUMMARY OF THE INVENTION

The method according to the invention for minimizing cell aging of a battery comprises detecting battery parameters which describe the current state of the battery, checking, on the basis of a prespecified aging model and the battery parameters, whether the state of the battery is an aging state in which cell aging of the battery is less pronounced in the event of cyclical charging and discharging than in an inoperative state in which the battery is not charged or discharged, and cyclical partial discharging and partial charging of the battery if the battery is in an aging state of this kind.

The battery according to the invention comprising an apparatus for minimizing cell aging of the battery comprises a measuring unit which is designed to detect battery parameters which describe the current state of the battery, a test unit which is designed to check, on the basis of a prespecified aging model and the battery parameters, whether the state of the battery is an aging state in which cell aging of the battery is less pronounced in the event of cyclical charging and discharging than in an inoperative state in which the battery is not charged or discharged, and a loading unit which is designed to load the battery by cyclical partial discharging and partial charging if the battery is in an aging state of this kind.

The method according to the invention and, respectively, the battery according to the invention are distinguished by reduced cell aging. This means that a battery of this kind and, respectively, a battery to which the method is applied has an increased service life. This results, in particular, in cost advantages, ecological advantages and improved user-friendliness.

In particular, the battery is cyclically partially discharged and partially charged by means of a resonant circuit. By virtue of a resonant circuit, the partial discharging and partial charging of the battery can be clocked with respect to time at the same time, as a result of which an additional clock is not required. In particular, a resonant circuit which uses a coil and a capacitor as oscillating elements is itself not subject to cell aging, in contrast to some other energy stores which are suitable for this application.

It is advantageous when the battery parameters include a battery current, a battery voltage, a battery temperature, a state of charge and/or a cell age. These parameters can be detected by means of a simple sensor system, and as a result in turn allow cost-effective and reliable implementation.

Furthermore, it is advantageous when the battery is cyclically partially discharged and partially charged only when the battery is connected to a charging device. In this case, energy loss from the battery, which is caused by partial discharging and partial charging of the battery, can be compensated for. Therefore, the battery remains ready for use at any time.

Similarly, it is advantageous when the energy which is output by the battery in the event of discharging is buffer-stored for subsequent charging of the battery. In this way, the energy which is required for partially charging the battery can be minimized. The battery can store energy over a relatively long time if no charging device is connected, and the energy consumption is reduced if a charging device is connected.

In particular, the battery is cyclically partially discharged and partially charged only when the state of charge of the battery is above a threshold value. Complete discharging of the battery or discharging of the battery below an energy content which is required by any possible further components which are connected to the battery is avoided.

It is advantageous when the loading unit of a battery according to the invention comprises a resonant circuit. By virtue of a resonant circuit, the partial discharging and partial charging of the battery can be clocked with respect to time at the same time, as a result of which an additional clock is not required. In particular, a resonant circuit which uses a coil and a capacitor as oscillating elements is itself not subject to cell aging, in contrast to some other energy stores which are suitable for this application.

Furthermore, it is advantageous when the battery comprising an apparatus for minimizing cell aging of the battery is a vehicle battery, in particular a traction battery. In this field in particular, high-performance requirements are placed on batteries, wherein there is a high cost pressure. Both requirements are met by a battery according to the invention.

In particular, the battery is a lithium-ion cell or an iron-metal hydride cell. These cells have properties in respect of their cell aging which are particularly expedient for the method.

BRIEF DESCRIPTION OF THE DRAWINGS

Exemplary embodiments of the invention will be described in detail below with reference to the accompanying drawing, in which.

DETAILED DESCRIPTION

Cell aging, that is to say total aging, of a battery is made up of calendar aging and cyclical aging. Calendar aging and cyclical aging can be superimposed in the case of most batteries. Cell aging can be described in the form of a model (abstractly) as an aging factor—and state-dependent function $f(AF1, AF2, Z1, Z2, \ldots, C0, t)$. Here, AF1, AF2 etc. . . . are the abovementioned aging factors. Z1, Z2 etc. describe states, such as storage, charging, discharging etc., and t is time. In this case, the batteries also contain electrochemical structures in which the derivative with respect to time of a function which describes cell aging of the battery is at a minimum in an operating state. Therefore, the rate of cell aging is minimal in this operating state.

In many batteries, it has been found that cyclical aging is less pronounced the smaller the cycle (=charging and discharging stroke). If, at the same time, calendar aging is inhibited by cyclization, that is to say by charging and discharging the battery, pure storage, as typically occurs, is less favorable than cyclization with small cycles. Therefore, the rate of aging can be reduced, and respectively the service life of the battery can be increased, for a corresponding electrochemical system by exciting small cycles, also called mini cycles.

Figure 1:
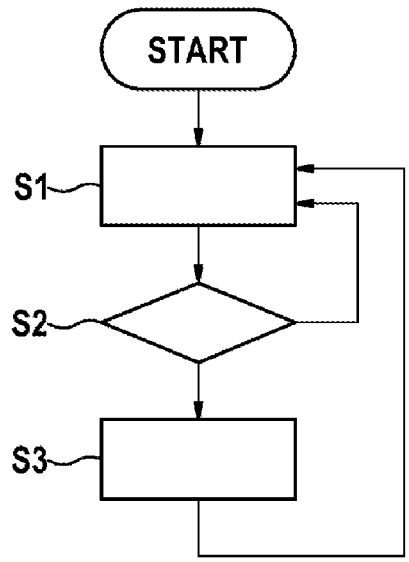
FIG. 1 shows a flowchart of the method according to the invention in one exemplary embodiment.

FIG. 1 shows a flowchart of a method according to the invention for minimizing cell aging of a battery 1 in one exemplary embodiment. The method is preferably carried out in a cyclical manner.

In a first method step S1, battery parameters which describe the current state of the battery 1 are detected. Battery parameters of this kind are, for example, a battery current, a battery voltage, a battery temperature, a state of charge and/or a cell age of the battery. The battery parameters which form the basis for an aging model which describes cell aging of the battery 1 are typically detected. The battery parameters can be detected by means of a suitable sensor system. A sensor system of this kind is already present in many batteries and can accordingly be used.

In a second method step S2, a check is made, on the basis of a prespecified aging model and the battery parameters, as to whether the state of the battery is an aging state in which cell aging of the battery 1 is less pronounced in the event of cyclical charging and discharging than in an inoperative state in which the battery is not charged or discharged. An aging model of this kind can be ascertained either from theoretical considerations or else by means of a series of experiments. For example, a plurality of physically identical batteries could be operated within the scope of different battery parameters and states in order to measure aging of the batteries (for example by ascertaining a capacitance or internal resistance) after a defined period of time and to approximate an aging function from the result.

In the embodiment described here, the aging model is described by an aging function which describes a maximum capacitance of the battery over a time profile depending on the detected battery parameters and at least one battery state. Here, the battery state is either a first state, in which the battery is cyclically charged and discharged, or a second state in which the battery is not cyclically charged and discharged. The derivative of this aging function is calculated. The derivative of this aging function can be interpreted as a rate of aging, that is to say the reduction in capacitance over time. A first result value is calculated based on the current time, the detected battery parameters and assuming the first state. A second result value is calculated based on the current time, the detected battery parameters and assuming the second state. The first result value is compared with the second result value.

If the first result value is less than or equal to the second result value, the battery is in an aging state in which cell aging of the battery 1 is more pronounced or equal in the event of cyclical charging and discharging than in an inoperative state in which the battery is not charged or discharged. In this case, the method branches back to the first method step S1.

If the first result value is greater than the second result value, the battery is in an aging state in which cell aging of the battery 1 is less pronounced in the event of cyclical charging and discharging than in an inoperative state in which the battery is not charged or discharged. The method branches to a third method step S3.

In the third method step S3, the battery 1 is cyclically partially discharged and partially charged. The battery is therefore moved to the first state, as a result of which cell aging of the battery is less pronounced in relation to the inoperative state. The battery 1 can be cyclically partially discharged and partially charged in this way by means of a resonant circuit. In this case, a resonant circuit is excited with the output of energy by the battery, and the battery 1 is therefore slightly discharged. The energy is returned to the battery in a defined oscillation state of the resonant circuit. The battery is therefore recharged. It is likewise possible to use other energy stores instead of the resonant circuit. For example, charge could be exchanged between two batteries in a battery pack.

In the embodiment of the method described here, the method branches back to the first method step S1 after a predefined time. A number of cycles of partial charging and partial discharging which are executed in the third method step depends substantially on the duration of these cycles. If partial charging and partial discharging take place by means of a resonant circuit, the duration of a cycle can typically be set by means of dimensioning a capacitance or an inductance in the resonant circuit.

Furthermore, the method can comprise an introductory method step in which monitoring is performed in respect of whether the battery 1 is connected to a charging device. The method is continued only when a charging device is connected. Losses occur in practice when the battery 1 is cyclically partially discharged and partially charged. Therefore, the state of charge of the battery can drop due to the battery 1 being cyclically partially discharged and partially charged. In order to prevent this, it is therefore advantageous to compensate for these losses by charging the battery by means of the charging device. To this end, energy could, for example, be supplied to the resonant circuit by means of the charging device.

As an alternative or in addition, the method can comprise a fourth method step in which monitoring is performed in respect of whether the state of charge of the battery is above a threshold value, wherein the battery is cyclically partially discharged and partially charged only when this condition is met. A threshold value of this kind could be, for example, 90% of the maximum state of charge (90% SOC). Since losses occur in practice when the battery 1 is cyclically partially discharged and partially charged and the state of charge of the battery can drop due to the battery 1 being cyclically partially discharged and partially charged, the battery is therefore prevented from moving to a state in which any possibly required battery charging is no longer available. Furthermore, deep-discharging of the battery 1 is also prevented.

Figure 2:
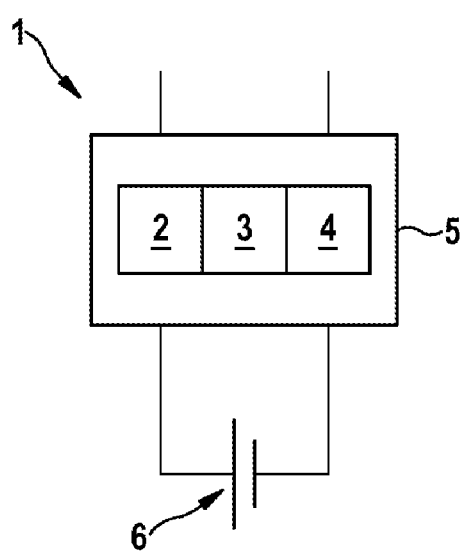
FIG. 2 shows a schematic illustration of a battery according to the invention in one exemplary embodiment.

FIG. 2 shows a schematic illustration of a battery 1 according to the invention in one exemplary embodiment. In this embodiment, the battery 1 comprises an individual battery cell 6 with a positive and a negative contact. However, in other embodiments, the battery 1 can also comprise a plurality of battery cells which are connected in parallel or in series.

An apparatus 5 for minimizing cell aging of the battery 1 is connected to the two contacts of the battery cell 6. In this case, cell aging of the battery 1 is, in particular, cell aging of the battery cell 6.

The apparatus 5 comprises a measuring unit 2 which is designed to detect battery parameters which describe the current state of the battery cell 6. To this end, the measuring unit 2 comprises a voltage sensor, a current sensor and a temperature sensor. Furthermore, the measuring unit 2 can comprise a timer for detecting a time. A state of charge of the battery 1 can be ascertained by a logic system, which is located in the measuring unit 2, from the voltage which is detected by the voltage sensor and from the current which is detected by the current sensor. Therefore, the measuring unit 2 is suitable for executing the first method step S1 which is described in the exemplary embodiment of the method according to the invention. The detected battery parameters, that is to say the voltage, the current, the temperature and the time, are transmitted to a test unit 3.

The apparatus comprises the test unit 3 which is designed to check, on the basis of a prespecified aging model and the battery parameters, whether the state of the battery 1 is an aging state in which cell aging of the battery 1 is less pronounced in the event of cyclical charging and discharging than in an inoperative state in which the battery 1 is not charged or discharged. To this end, the second method step S2 which is described in the exemplary embodiment of the method according to the invention is carried out by a computer unit which forms part of the test unit. In this case, the aging function could be stored in the form of a mathematical function in a digital memory. If the test unit 3 ascertains that cell aging of the battery 1 is less pronounced in the event of cyclical charging and discharging than in an inoperative state, an activation signal is output by the test unit. The test unit 3 is therefore a unit which measures the state and the aging factors of the cell and, from the result, uses a previously parameterized aging model to determine whether cyclical partial discharging and partial charging of the battery or purely calendar aging means less pronounced cell aging overall under the external conditions (the given battery parameters). If cyclical partial discharging and partial charging of the battery 1 means less pronounced cell aging overall, a loading unit 4 which ensures said cyclical partial discharging and partial charging of the battery 1 is connected to the battery 1.

In addition, the apparatus comprises the loading unit 4 which is designed to load the battery 1 by cyclical partial discharging and partial charging if the battery 1 is in an aging state in which cyclical partial discharging and partial charging of the battery 1 means less pronounced cell aging overall. The loading unit is connected to the test unit 3 in such a way that said loading unit can be activated by the activation signal. In the event of activation by the activation signal, an electromagnetic resonant circuit which forms part of the loading unit is connected to the positive contact and to the negative contact of the battery cell 6 in such a way that the resonant circuit is made to oscillate by energy which is output by the battery cell 6. During return oscillation, the resonant circuit is connected to the positive contact and to the negative contact of the battery cell 6 by means of a charging circuit in such a way that the battery cell 6 is charged by means of the resonant circuit.

In its simplest form, a resonant circuit of this kind consists of a capacitance and an inductance and also a non-reactive resistor which is to be selected to be as small as possible. The resonant circuit can be connected to the battery cell 6 by a switch. The battery cell 6 discharges into the resonant circuit. The battery cell 6 is then recharged by means of the resonant circuit. The oscillation is damped. Therefore, in order to avoid discharging of the battery, the battery 1 could be cyclically partially discharged and partially charged only when connected to an electrical charging device. In this case, a charging current, for example, can be detected by the measuring unit 2 and activation of the loading unit 4 can be suppressed if there is no charging current or the charging current is too low. Similarly, activation of the loading unit 4 could be suppressed when the state of charge of the battery 1 is below a residual charging threshold (for example 90% of the SOC). A cycle amplitude and a cycle frequency which are matched to the special aging properties of the battery cell 6 can be determined by appropriate selection of the capacitance and the inductance. In this case, the cycle amplitude is described by the amount of energy which is output and, respectively, absorbed by the battery cell 6 during cyclical partial discharging and partial charging. The cycle frequency describes the duration of a cyclical run through the cyclical partial discharging and partial charging.

In addition to the above written disclosure, reference is explicitly made to the disclosure of FIGS. 1 and 2.

The invention claimed is:

1. A method for minimizing cell aging of a battery, the method comprising:
    detecting, via at least one selected from the group consisting of a voltage sensor, a current sensor, and a temperature sensor, battery parameters which describe the current state of the battery,
    checking, via a computer and on the basis of a prespecified aging model and the battery parameters, whether the state of the battery is an aging state in which cell aging of the battery is less pronounced in the event of cyclical charging and discharging than in an inoperative state in which the battery is not charged or discharged,
    cyclical partial discharging and partial charging of the battery when the battery is in the aging state and when the state of charge of the battery is above a threshold value, the threshold value being greater than zero.

2. The method as claimed in claim 1, wherein the battery is cyclically partially discharged and partially charged by means of a resonant circuit.

3. The method as claimed in claim 1, wherein the battery parameters include a battery current, a battery voltage, a battery temperature, a state of charge, a cell age, or a combination of the same.

4. The method as claimed in claim 1, wherein the battery is cyclically partially discharged and partially charged only when the battery is connected to a charging device.

5. The method as claimed in claim 1, wherein the energy which is output by the battery in the event of discharging is buffer-stored for subsequent charging of the battery.

6. The method as claimed in claim 1, wherein the threshold value is approximately 90%.

7. A battery comprising:
a measuring unit which is designed to detect battery parameters which describe the current state of the battery,
a test unit which is designed to check, on the basis of a prespecified aging model and the battery parameters, whether the state of the battery is an aging state in which cell aging of the battery is less pronounced in the event of cyclical charging and discharging than in an inoperative state in which the battery is not charged or discharged, and
a loading unit which is designed to load the battery by cyclical partial discharging and partial charging when the battery is in the aging state and when the state of charge of the battery is above a threshold value, the threshold value being greater than zero.

8. The battery as claimed in claim 7, wherein the loading unit comprises a resonant circuit.

9. The battery as claimed in claim 7, wherein the battery is a vehicle battery.

10. The battery as claimed in claim 7, wherein the battery is a lithium-ion cell or an iron-metal hydride cell.

11. The battery as claimed in claim 7, wherein the threshold value is approximately 90%.

* * * * *